United States Patent [19]

Hanakura et al.

[11] Patent Number: 4,835,475
[45] Date of Patent: May 30, 1989

[54] BATTERY TESTER INCLUDING A THERMOCHROMIC MATERIAL

[76] Inventors: Niichi Hanakura, 1-9-10, Toneyama, Toyonaka-shi, Osaka-fu; Ryuichiro Nagaoka, A5-410, 2-24, Shinsenrinishimachi, Toyonaka-shi, Osaka-fu, both of Japan

[21] Appl. No.: 105,359

[22] Filed: Oct. 7, 1987

[30] Foreign Application Priority Data

Nov. 17, 1986 [JP] Japan .................. 61-176372[U]
Jan. 20, 1987 [JP] Japan .................. 62-6353[U]
Apr. 24, 1987 [JP] Japan .................. 62-102350

[51] Int. Cl.$^4$ .................. G01N 27/46; G09G 3/34
[52] U.S. Cl. .................. 324/435; 340/786
[58] Field of Search .................. 324/435, 437; 340/786; 350/351, 350 R

[56] References Cited

U.S. PATENT DOCUMENTS 4,045,383 8/1977 Koff .................. 340/786
4,702,564 10/1987 Parker .................. 350/351

*Primary Examiner*—Reinhard J. Eisenzopf
*Assistant Examiner*—Walter E. Snow
*Attorney, Agent, or Firm*—Varndell Legal Group

[57] ABSTRACT

This invention provides an apparatus for indicating the electromotive force of a dry battery which comprises:
(i) a film base;
(ii) an electrically conductive layer disposed on one side of the film base,
(iii) a protective layer disposed on the electrically conductive layer, and
(iv) a thermochromic layer disposed on the other side of the film base.

21 Claims, 3 Drawing Sheets

BATTERY TESTER INCLUDING A THERMOCHROMIC MATERIAL

FIELD OF THE INVENTION

The present invention relates to an apparatus for measuring and indicating the electromotive force of a dry battery.

BACKGROUND OF THE INVENTION

As an apparatus for indicating the electromotive force of a dry battery, a device employing a liquid crystal is known (For example, U.S. Pat. No. 4,006,414). The apparatus (hereinafter referred to briefly as a battery checker) of this type is based on the principle that the liquid crystal heated by an electrically conductive resistance element adapted to generate heat on contact with the electrodes of a dry battery changes its optical property in response to the temperature change caused by the generated heat to undergo visible coloration or change in color, thus enabling to ascertain the residual energy of the dry battery which is represented by electromotive force. However, this liquid crystal device has much to be improved, as indicated below.

(a) Since the developed color or the induced change in color is not distinct, it is impossible to accurately estimate the electromotive force.

(b) Since the color varies according to the viewing angle, a variation in results of measurements is inevitable.

(c) Since the change in color indicating the electromotive force is monotonous or the variety of developed colors is very limited, the device is not suited for use by people with dyschromatopsia.

(d) Since color variation temperatures are fixed for a given kind of liquid crystal, it is impossible to freely adjust the combination of color variation temperature with color developed.

(e) Since the liquid crystal cannot be mixed with pigments, dyes or the like, the color tones cannot be modified.

(f) The device is expensive.

(g) Liquid crystals are generally poor in light fastness and their light fastness cannot be improved because ultraviolet absorbers and the like cannot be incorporated.

SUMMARY OF THE INVENTION

It is an object of the present invention to provide a battery checker which is capable of accurate estimation and display of the electromotive force of a dry battery.

It is another object of the present invention to provide a wide variety of battery checkers which are broadly variable in color developed and assure a distinct change in color depending on electromotive force.

It is still another object of the present invention to provide a battery checker having a broadened choice of combination between color variation temperature and color.

It is a further object of the present invention to provide a battery checker which is less expensive and more durable.

Other objects and advantageous features of the present invention will become apparent as the following description proceeds.

After an extensive research undertaken to overcome the above-mentioned disadvantages of the conventional battery checker utilizing a liquid crystal, the present inventors came upon the idea of utilizing a reversible thermochromic material which changes color at a given temperature and conducted a further study which has resulted in the present invention.

Thus, the present invention provides a battery checker for detecting and indicating the electromotive force of a dry battery which comprises:

(i) a film base, (ii) an electrically conductive layer disposed on one side of said film base, (iii) a protective layer disposed on said electrically conductive layer, and (iv) a thermochromic layer disposed on the other side of said film base.

In another aspect, the present invention provides a battery checker for detecting and indicating the electromotive force of a dry battery which comprises:

(i) a film base, (ii) an electrically conductive layer disposed on one side of said film base, (iii) a protective layer disposed on said electrically conductive layer, (iv) a non-thermochromic layer disposed on the other side of said film base, and a thermochromic layer disposed on said non-thermochromic layer.

In still another aspect, the present invention provides a battery checker for detecting and indicating the electromotive force of a dry battery which comprises:

(i) a film base, (ii) an electrically conductive layer disposed on one side of said film base, (iii) a thermochromic layer disposed on said electrically conductive layer, and (iv) a protective layer optionally disposed on said thermochromic layer.

In still another aspect, the present invention provides a battery checker for detecting and indicating the electromotive force of a dry battery which comprises:

(i) a film base, (ii) an electrically conductive layer disposed on one side of said film base, (iii) a non-thermochromic layer disposed on said electrically conductive layer, (iv) a thermochromic layer disposed on said non-thermochromic layer, and (iv) a protective layer optionally disposed on said non-thermochromic layer.

In still another aspect, the present invention provides a battery checker for detecting and indicating the electromotive force of a dry battery which comprises:

(i) a film base, (ii) a thermochromic layer disposed on one side of said film base, (iii) an electrically conductive layer disposed on said thermochromic layer, and (iv) a protective layer optionally disposed on said electrically conductive layer.

In still another aspect, the present invention provides a battery checker for detecting and indicating the electromotive force of a dry battery which comprises:

(i) a film base, (ii) a thermochromic layer disposed on one side of said film base, (iii) a non-thermochromic layer disposed on said thermochromic layer, (iv) an electrically conductive layer disposed on said non-thermochromic layer, and (iv) a protective layer optionally disposed on said electrically conductive layer.

DETAILED DESCRIPTION OF THE INVENTION

The present invention will be described in detail hereinafter, referring to the accompanying drawings in which.

It should be understood that the relative dimensions of each component in these views may not be true to the actual relative dimensions thereof.

Figure 1:
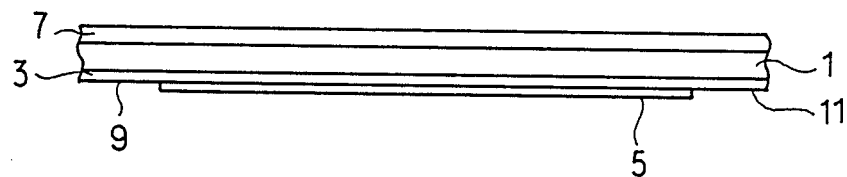
FIG. 1 is a side elevation showing a battery checker embodying the principle of the present invention.
Figure 2:
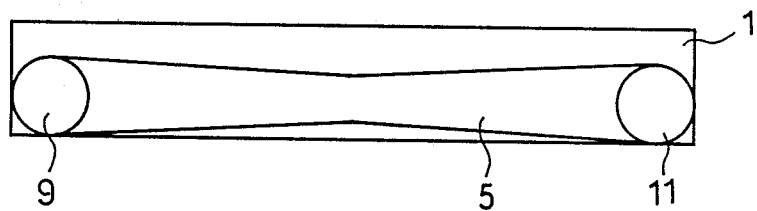
FIG. 2 is a bottom view of the battery checker shown in FIG. 1.
Figure 3:
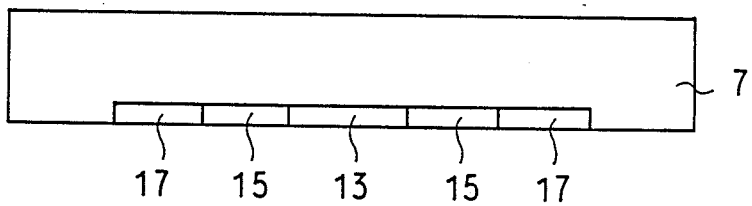
FIG. 3 is a plan view of the battery checker shown in FIG. 1.

The battery checker of the present invention, as illustrated in FIGS. 1, 2 and 3, comprises a film base 1, an electrically conductive layer 3 disposed thereon and varying in electrical resistivity from its central portion to its terminal portions, and a protective layer 5 disposed on said electrically conductive layer 3. However, the protective layer 5 does not cover terminal portions 9 and 11 of said electrically conductive layer 3, said terminal portions being intended to serve as contact portions to be brought into contact with the two electrodes of a dry battery. Disposed on the other side of said film base 1 is a thermochromic layer 7 which changes color at a predetermined temperature. If necessary, a second protective layer (not shown) of transparent resin may be disposed on said thermochromic layer 7.

The film base 1 may be made of any desired dielectric material. However, it is preferable to use a dielectric polymer material which is sufficiently heat-resistant, least likely to undergo thermal shrinkage or deformation, so flexible that it can be easily bent but returns to its original shape on release of the force, and satisfactory in heat conductivity. Generally, polyimide resin, polyester resin and the like are advantageously employed. The thickness of the film base 1 is not particularly limited but preferably in the range of about 0.05 to 0.8 mm.

Figure 4:
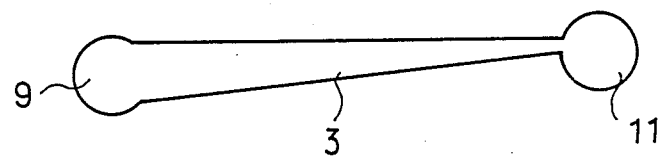
FIG. 4 is a plan view of another embodiment of the invention, showing only the electrically conductive layer of different configuration.
Figure 5:
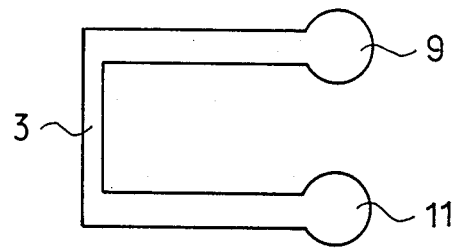
FIG. 5 shows another embodiment of the invention with a different configuration of the electrically conductive layer.

The electrically conductive layer 3 can be formed by any known technique such as coating with an electrically conductive ink, vacuum vapor deposition of an electrically conductive metal, etc. The electrically conductive layer 3 can be formed in an optional configuration so long as it gives a gradient of electrical resistivity between its central portion and its terminal portions. For example, as shown in FIG. 2, the relative width of the central portion may be decreased in comparison with said terminal portions 9 and 11 for contact with electrodes of the dry battery. Or, though not shown, the electrically conductive layer 3 may be formed with the same width throughout its length and the thickness of its central portion be diminished. As a further alternative, as illustrated in FIG. 4, the electrically conductive layer 3 may be tapered from one terminal portion 9 to the other 11. As a still further alternative, the electrically conductive layer 3 may have a form as illustrated in FIG. 5 so that the battery checker may be used for checking a dry battery equipped with positive and negative electrodes on top of its housing.

The protective layer 5 prevents oxidation and open-circuit of the electrically conductive layer 3. The protective layer 5 covers at least the surface of the electrically conductive layer 3 excepting the terminal contact portions 9 and 11 and may extend laterally of the surface of film base 1 where the electrically conductive layer 3 is not formed. The protective layer 5 may be made of any material that has a high adhesion to the electrically conductive layer 3 and film base 1. It is usually made of a synthetic resin conventionally used in coating compositions such as polyamide, xylene resin, cyclopentadiene resin, etc. or a natural resin. The protective layer 5 can be formed by coating the substrate surface with a solution of such resin. Alternatively, the protective layer 5 may be formed by direct lamination of a film of, for example, polyethylene on the electrically conductive layer 3 or on the electrically conductive layer 3 and film base 1. While there is no particular limitation on the thickness of the protective layer 5, it is generally in the range of about 0.01 to 0.04 mm.

The thermochromic layer 7 contains a thermochromic color material and a non-thermochromic color material. The thermochromic color material is a color material known as "reversible thermochromic material" or "thermo-color", and generally consists of a dye, a color developer and a desensitizing agent. By selecting suitable kinds of desensitizers, such color material compositions can be caused to change color (develop or lose a color) at desired temperatures. Such thermo-color materials are known per se and there is no limitation on usable thermo-color materials.

Reversible thermochromic or thermo-color materials which can be used as the thermochromic materials in the present invention contain (1) an electron donor coloring organic compound, (2) an aromatic compound with a phenolic hydroxyl group and/or carboxyl group directly combined with a benzene ring, and (3) a fatty acid with not less than 8 carbon atoms. These thermochromic color materials provide a sharp and reversible color change in accordance with a change in temperature. By color change, it is understood that wide ranging color changes can be utilized, such as, fading, developing, change of color, intensity or hue, etc.

The electron donor coloring organic compounds (coloring agents or dyes) are organic compounds which are developed or have their color changed by the reaction with the developers, which are discussed below. These coloring agents include triphenylmethanephthalides, fluoranes, phenothiazines, indolphthalides, leukoauramines, spiropyranes, rhodaminelactams, etc. These organic compounds have been used as coloring agents for pressure sensitive copy paper. Hundreds of these coloring agents have been developed, which give a variety of hues and by which a wide variety of color arrangements are possible. Examples of such coloring agents are shown below:

Triphenylmethanephthalides

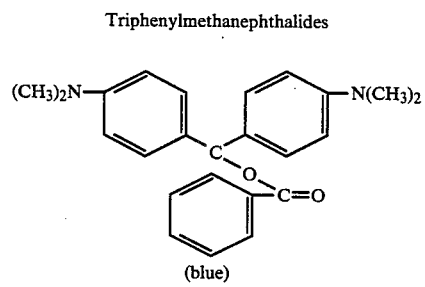
(blue)

Indolphthalides

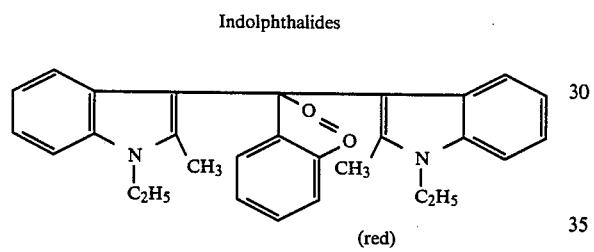
(red)

Leucoauramines

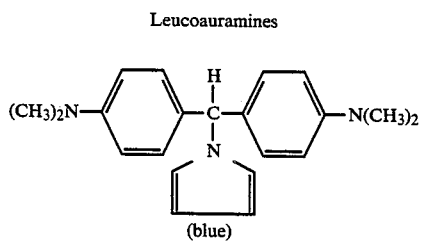
(blue)

Spriopyrans

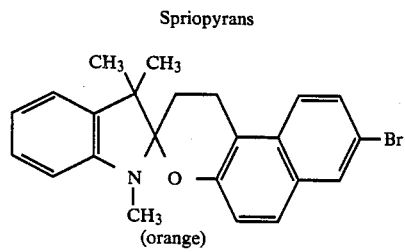
(orange)

Fluoranes

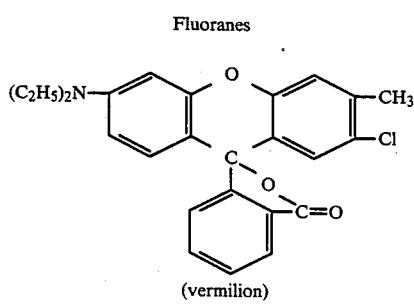
(vermilion)

-continued

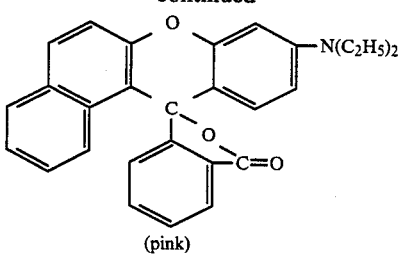
(pink)

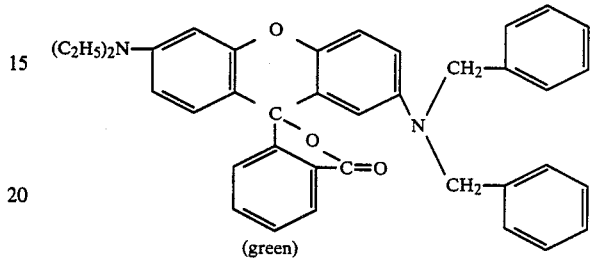
(green)

Phenothiazines

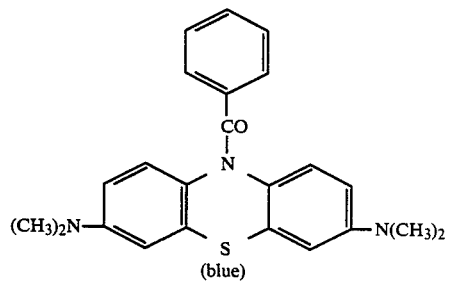
(blue)

Rhodaminelactams

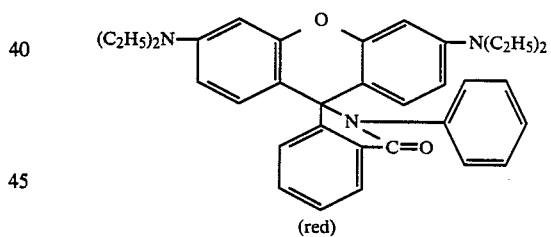
(red)

In the above formulas, the color the organic compound when developed is shown in parenthesis.

As developers, used to develop or to change the color of the above coloring agents, aromatic compounds with a phenolic hydroxyl group and/or with carboxyl group directly combined with a benzene ring can be used. These compounds are hereinafter referred to as developers. In the past, clay minerals, such as silicone or clay, have been used to develop the above coloring agents, but reversible thermochromic materials of practical value could not be obtained by the use of such minerals. Examples of developer which have excellent developing properties and which can be used to provide reversible thermochromic materials of practical value include 4-t-butylphenol, 4-oxydiphenylether, α-naphthol, β-napthol, p-oxymethylbenzoate, p-oxyacetophenone, 2,2'-methylenebis-(4-methyl-6-t-isobutylphenol), p-phenylphenol, 4,4'-isopropylydenediphenol (bisphenol A), 2,2'-methylenebis(4-chlorophenol), hydroquinone, 2-oxy-1- naphtoic acid, 2-oxy-p-toluylic acid salicylic acid, m-oxybenzoic acid, 4-oxyphthalic acid, phloroglucin-carboxylic acid, gallic acid, propylgallate, and phthalic acid.

With the use of one or more kinds of these developers, the temperature of color change can be adjusted. The mixing ratio of developers to coloring agents is normally 1:1–1:15 by weight.

The fatty acids used in the reversible thermochromic material can improve fading and developing properties and heighten the sharpness thereof. Preferably fatty acids are listed below where the figures in the parentheses are the melting points of pure fatty acids, the temperature of color change of each acid being approximate to the melting point: caprylic acid (16.5° C.), pelargonic acid (13° C.), capric acid (31.3° C.), lauric acid (43.6° C.), myristic acid (58.0° C.), palmitic acid (62.9° C.), stearic acid (69.9° C.), arachic acid (75.2° C.), behenic acid (80.2° C.), lignoceric acid (84.2° C.), and cerotic acid (87.7° C.).

The above fatty acids may be used singly or in a mixture of two or more.

The amount of fatty acid is normally 1–100 wt. % per 1 weight part of the developer. Thermochromic action becomes slow when the amount is less than 1 wt. % whereas color is diluted when over 100 wt. %.

The reversible thermosensitive (fading) composition composed of these three components can be used singly as a reversible thermochromic material and, if necessary, may be used together with proper additives. For example, the combination with dyes or pigments without a fading property gives a thermochromic material which can change the hue according to the fading or developing of the above thermosensitive (fading) composition. Further, other additives may be used with thermochromic materials as required.

In the present invention, one or more of such thermochromic color materials are employed. The term 'non-thermochromic color material' as used in this specification and the claims appended thereto means any known color material that does not change color at temperatures up to about 100° C. Such colors include common pigments, fluorescent pigments, etc. which are used in paints and inks, such as phthalocyanine blue, fast yellow, carmine red, red iron oxide and so on. In the practice of the present invention, one or more of such non-thermochromic color materials are employed. The thermochromic layer 7 is formed by coating a substrate surface with a coating composition comprising a thermochromic color material, a non-thermochromic color material, a resin having a high adhesion to the film base 1, a conventional hardener and a viscosity builder. Examples of the resins are synthetic resins such as vinyl acetate resin, acrylic resin, vinyl acetate-acrylic copolymer, polyamide and so on.

Figure 6:
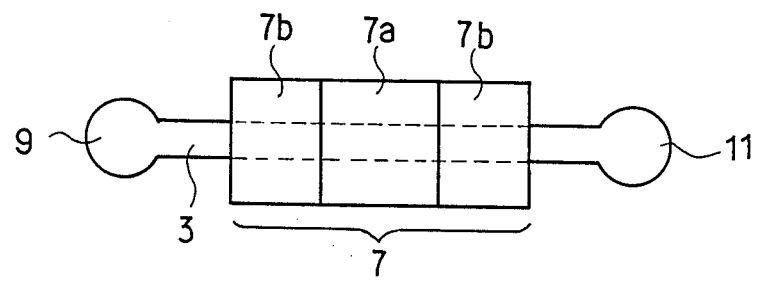
FIG. 6 shows another embodiment of the invention with three thermochromic segments.

The thermochromic layer 7 need not necessarily be composed of a single thermochromic material. Thus, for example, as shown in FIG. 6, it may consist of two thermochromic materials forming segments 7a and 7b, either of the same color or of different colors, which change color at different temperatures. As an alternative, two or more thermochromic layers of different colors may be provided in separated segments (not shown). The thickness of such a thermochromic layer varies with the coverage required for each kind of color material but is generally in the range of about 0.05 to 0.8 mm.

In an embodiment similar to that shown in FIG. 1, a thermochromic layer 7 which becomes transparent on heating can be formed on a colored film base 1 containing a pigment. Alternatively, on a white film base 1 can be formed a thermochromic layer 7 comprising patterned portions which become transparent on heating and non-patterned portions which do not change color when heated.

Figure 7:
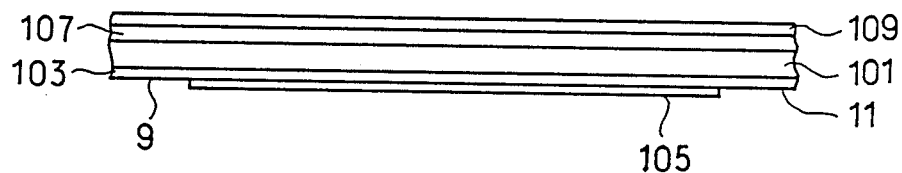
FIG. 7 is a side elevation of another embodiment of the invention.
Figure 8:
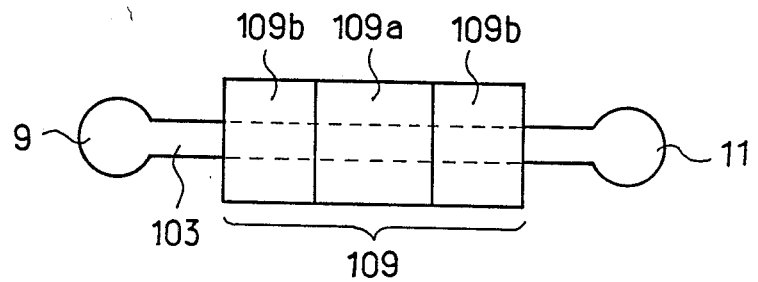
FIG. 8 shows an embodiment of the invention similar to that shown in FIG. 6.

In another embodiment illustrated in FIGS. 7 and 8, the battery checker according to the present invention comprises an electrically conductive layer 103 and a protective layer 105 as successively disposed on one side of a film base 101 and a non-thermochromic layer 107 which does not change color at temperatures up to, for example, 100° C. and a thermochromic layer 109 adapted to change color at a predetermined temperature below 100° C. as successively disposed on the other side of said film base 101. Except that the non-thermochromic material and thermochromic material form separate layers, the battery checker shown in FIGS. 7 and 8 is substantially identical with the battery checker shown in FIGS. 1 through 6.

The non-thermochromic layer 107 is a color layer which does not change color by the heat transferred from the electrically conductive layer 103 through the film base 101. This non-thermochromic layer 107 is formed by coating the substrate surface with a coating composition comprising the non-thermochromic color material explained above and a resin base or vehicle such as a synthetic resin, e.g. polyamide, xylene resin, cyclopentadiene resin, etc., or a natural resin. The thickness of this non-thermochromic layer 107 is not particularly limited and usually in the range of about 0.05 and 0.3 mm. The non-thermochromic layer 107 need not necessarily be composed of a single non-thermochromic color material but may be made up of two or more kinds of materials of the same shade. Or, it may be formed of two or more color materials of different colors or shades in a pattern.

The thermochromic layer 109 may be a coated-on layer formed by using a thermochromic color material and a resin vehicle having a good adhesion to said non-thermochromic layer 107 or a printed layer formed by using a printing composition containing the thermochromic color material as microencapsulated with the resin. Examples of the resins are a synthetic resin such as vinyl acetate resin, acrylic resin, vinyl acetate-acrylic copolymer, polyamide and so on. The thermochromic color layer need not be composed of a single thermochromic color material but, as shown in FIG. 8, it may consist of two different thermochromic segments 109a and 109b, either of the same color or of different colors, which change color at different temperatures. As an alternative, two or more thermochromic layers of different colors may be used in separated portions. The thickness of such a thermochromic layer varies with the coverage required for each kind of color material but is generally in the range of about 0.05 to 0.5 mm.

Figure 9:
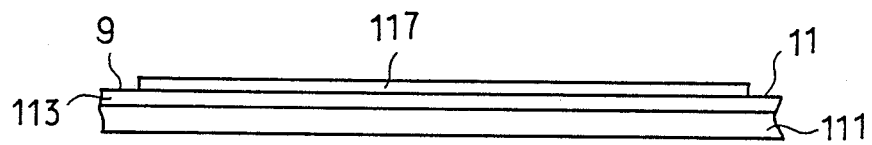
FIG. 9 shows another embodiment of the invention in which electrically conductive layer and the thermochromic layer are formed on the same side of the film base.

In another embodiment shown in FIG. 9, the battery checker of the invention comprises an electrically conductive layer 113 and a thermochromic layer 117 disposed on the same side of a film base 111. A transparent protective layer (not shown) may be formed on the thermochromic layer 117, when required.

Figure 10:
FIG. 10 shows still another embodiment of the invention in which the electrically conductive layer, the non-thermochromic layer and the thermochromic layer are formed on the same side of the film base.

In the battery checker shown in FIG. 10, an electrically conductive layer 123, a non-thermochromic layer 125 and a thermochromic layer 127 are formed successively on one side of a film base 121. A transparent protective layer (not shown) can be optionally disposed on the thermochromic layer 127.

Figure 11:
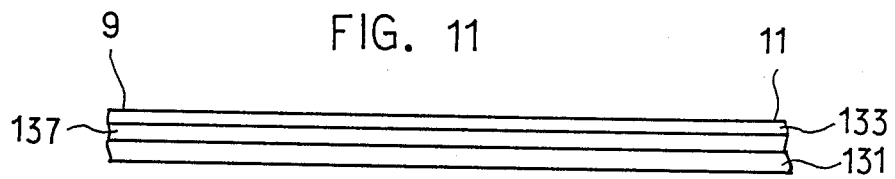
FIG. 11 shows still another embodiment of the invention in which the thermochromic layer and the electrically conductive layer are formed on the same side of the film base.

In still another embodiment of the invention, the battery checker comprises a thermochromic layer 137 and an electroconductive layer 133 formed on the same side of a film base 131, as illustrated in FIG. 11. The film base 131 is preferably transparent for easy detection of color change. The battery checker of FIG. 11 may be formed of a protecting layer (not shown) on the electrically conductive layer 133 excepting the terminal portions 9 and 11.

Figure 12:
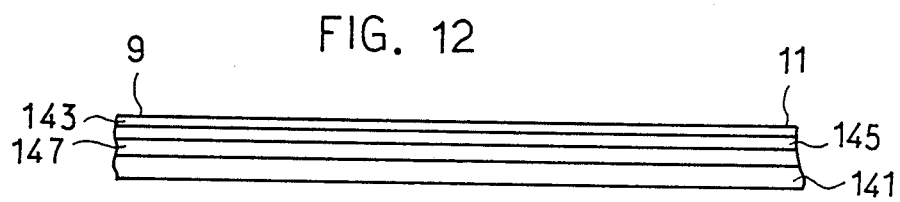
FIG. 12 shows still another embodiment of the invention in which the thermochromic layer, the non-thermochromic layer and the electroconductive layer are disposed on the same side of the film base.

FIG. 12 shows a still another embodiment of the invention in which a thermochromic layer 147, a non-thermochromic layer 145 and an electrically conductive layer 143 are formed on the same side of a film base 141. The film base 141 is preferably transparent for clear indication of color change. The battery checker shown in FIG. 12 also can have a protecting layer formed on the electroconductive layer 143 excepting the terminal portions 9 and 11.

To measure the electromotive force of a dry battery using the battery checker illustrated in FIGS. 1 through 6, the flexible contact portions 9 and 11 of the battery checker are brought into force contact with the two electrodes of the dry battery. The heat generated in the electrically conductive layer 3 is transferred to the thermochromic layer 7 through the film base 1, whereby the thermochromic color material in the thermochromic layer 7 is caused to change color. Since the color of the thermochromic layer 7 as the composite product of the thermochromic color material and non-thermochromic color material undergoes a clear-cut change from the color before heating by the dry battery to the color after the heating, the electromotive force of the dry battery is clearly indicated. Referring, specifically, to the electrically conductive layer 3 shown in FIG. 2, as the central narrow portion is heated to the highest temperature, the heat is transferred from this portion in the longitudinal direction of the battery checker so that the color of the thermochromic layer 7 changes progressively in the longitudinal direction.

In this connection, when the color change regions are made distinct, for example by the provisions of segments 13, 15 and 17 in FIG. 3, it is possible to ensure that the color change extends to region 17 when the electromotive force is sufficiently high, it extends only to region 15 when the electromotive force has decreased somewhat, and it is limited to region 13 when the electromotive force has decreased to the extent that the dry battery is substantially no longer useful.

When the thermochromic layer 7 contains a thermochromic material which becomes colorless or clear when heated, the color of the non-thermochromic layer is directly observed at measurement as an indication of the electromotive force of the dry battery.

In this connection, if the thermochromic layer 7 contains two or more thermochromic materials which change color at different temperatures as mentioned above, the color displayed changes according to the magnitude of residual electromotive force so that the estimation of the electromotive force of the dry battery is further facilitated.

In order to estimate the electromotive force using the battery checker shown in FIGS. 7 and 8, the flexible contact portions 111 and 113 of the battery checker are brought into forced contact with the electrodes of the dry battery. The heat generated in the electrically conductive layer 103 of the battery checker is transferred to the thermochromic layer 109 through the film base 101 and non-thermochromic layer 107, whereby the thermochromic layer 109 is caused to change color. Since, thus, the color as the composite product of the non-thermochromic layer 107 and thermochromic layer 109 undergoes a distinct change, the electromotive force of the dye battery is clearly indicated.

Other types of the battery checkers illustrated in FIG. 9 through FIG. 12 are used for detecting the remaining electromotive force of a dry battery in the similar manner as stated above.

The present invention provides the following remarkable effects.

(i) Since the thermochromic layer changes color in a well-articulated manner in response to the generation of heat in the electrically conductive layer, the electromotive force of the dry battery can be accurately estimated.

(ii) Since the color of the thermochromic material and the color of the non-thermochromic material in the thermochromic layer can be freely selected from a broad range of colors, the color difference can be amplified so that an accurate estimation of the electromotive force may be made irrespective of the viewing angle.

(iii) By forming the thermochromic layer in patterned segments or by selecting a suitable combination of colors for the thermochromic material and non-thermochromic material in the thermochromic layer, a battery checker which one with dyschromatopsia can use may be provided.

(iv) By selecting a suitable type of desensitizer for incorporation in the thermochromic layer, the temperature of color development or fading can be controlled as desired.

(v) Since the thermochromic material and non-thermochromic material can be freely admixed with other coloring materials, e.g. dyes and pigments, the color to be developed can be freely controlled. Moreover, multiple-layer coating is also possible.

(vi) Since the thermochromic and non-thermochromic color materials are by far less expensive than liquid crystals, the manufacturing cost of the battery checker is remarkably decreased.

(vii) Since an ultraviolet absorber and other additives can be incorporated in the thermochromic layer, the weather resistance of the battery checker can be remarkably increased.

We claim:

1. An apparatus for indicating the electromotive force of a dry battery which comprises:
    (i) a film base,
    (ii) an electrically conductive layer disposed on one side of said film base,
    (iii) a protective layer disposed on said electrically conductive layer, and
    (iv) a thermochromic layer disposed on the other side of said film base, said thermochromic layer including a dye, a color developer and a desensitizing agent.

2. An apparatus for indicating the electromotive force of a dry battery as claimed in claim 1 wherein said electrically conductive layer varies in electrical resistivity from its central portion to its terminal portions.

3. An apparatus for indicating the electromotive force of a dry battery as claimed in claim 1 wherein said thermochromic layer consists of thermochromic segments which change color at different temperatures.

4. An apparatus for indicating the electromotive force of a dry battery which comprises:
(i) a film base,
(ii) an electrically conductive layer disposed on one side of said film base,
(iii) a protective layer disposed on said electrically conductive layer, and
(iv) a non-thermochromic layer disposed on the other side of said film base, and
(v) a thermochromic layer disposed on said non-thermochromic layer, said thermochromic layer including a dye, a color developer and a desensitizing agent.

5. An apparatus for indicating the electromotive force of a dry battery as claimed in claim 4 wherein said electrically conductive layer varies in electrical resistivity from its central portion to its terminal portions.

6. An apparatus for indicating the electromotive force of a dry battery as claimed in claim 4 wherein said thermochromic layer consists of thermochromic segments which change color at different temperatures.

7. An apparatus for indicating the electromotive force of a dry battery as claimed in claim 4 wherein said thermochromic layer consists of segments containing thermochromic materials of different colors.

8. An apparatus for indicating the electromotive force of a dry battery which comprises:
(i) a film base,
(ii) an electrically conductive layer disposed one side of said film base,
(iii) a thermochromic layer disposed on said electrically conductive layer, said thermochromic layer including a dye, a color developer and a desensitizing agent, and
(iv) a protective layer optionally disposed on said thermochromic layer.

9. An apparatus for indicating the electromotive force of a dry battery as claimed in claim 8 wherein said electrically conductive layer varies in electrical resistivity form its central portion to its terminal portions.

10. An apparatus for indicating the electromotive force of a dry battery as claimed in claim 8 wherein said thermochromic layer consists of thermochromic segments which change color at different temperatures.

11. An apparatus for indicating the electromotive force of a dry battery which comprises:
(i) a film base,
(ii) an electrically conductive layer disposed on one side of said film base,
(iii) a non-thermochromic layer disposed on said electrically conductive layer,
(iv) a thermochromic layer disposed on said non-thermochromic layer, said thermochromic layer including a dye, a color developer and a desensitizing agent, and
(iii) a protective layer optionally disposed on said nonthermochromic layer.

12. An apparatus for indicating the electromotive force of a dry battery as claimed in claim 11 wherein said electrically conductive layer varies in electrical resistivity from its central portion to its terminal portions 13. An apparatus for indicating the electromotive force to a dry battery as claimed in claim 11 wherein said thermochromic layer consists of thermochromic segments which change color at different temperatures.

14. An apparatus for indicating the electromotive force of a dry battery as claimed in claim 11 wherein said thermochromic layer consists of segments containing thermochromic materials of different colors.

15. An apparatus for indicating the electromotive force of a dry battery which comprises:
(i) a film base,
(ii) a thermochromic layer disposed on one side of said film base, said thermochromic layer including a dye, a color developer and a desensitizing agent
(iii) an electrically conductive layer disposed on said thermochromic layer, and
(iv) a protective layer optionally disposed on said electrically conductive layer.

16. An apparatus for indicating the electromotive force of a dry battery as claimed in claim 15 wherein said electrically conductive layer varies in electrical resistivity from its central portion to its terminal portions.

17. An apparatus for indicating the electromotive force of a dry battery as claimed in claim 15 wherein said thermochromic layer consists of thermochromic segments which change color at different temperatures.

18. An apparatus for indicating the electromotive force of a dry battery which comprises:
(i) a film base,
(ii) a thermochromic layer disposed on one side of said film base, said thermochromic layer including a dye, a color developer and a desensitizing agent
(iii) a non-thermochromic layer disposed on said thermochromic layer,
(iv) an electrically conductive layer disposed on said non-thermochromic layer, and
(v) a protective layer optionally disposed on said electrically conductive layer.

19. An apparatus for indicating the electromotive force of a dry battery as claimed in claim 18 wherein said electrically conductive layer varies in electrical resistivity from its central portion to its terminal portions.

20. An apparatus for indicating the electromotive force of a dry battery as claimed in claim 18 wherein said thermochromic layer consists of thermochromic segments which change color at different temperatures.

21. An apparatus for indicating the electromotive force of a dry battery as claimed in claim 18 wherein said thermochromic layer consists of segments containing thermochromic materials of different colors.

* * * * *